United States Patent [19]

Sakurai

[11] Patent Number: 4,958,326
[45] Date of Patent: Sep. 18, 1990

[54] SEMICONDUCTOR MEMORY DEVICE HAVING A FUNCTION OF SIMULTANEOUSLY CLEARING PART OF MEMORY DATA

[75] Inventor: Takayasu Sakurai, Tokyo, Japan

[73] Assignee: Kabushiki Kaisha Toshiba, Kawasaki, Japan

[21] Appl. No.: 274,555

[22] Filed: Nov. 22, 1988

[30] Foreign Application Priority Data

Nov. 30, 1987 [JP] Japan ................................ 62-302678

[51] Int. Cl.$^5$ ................................ G11C 7/00
[52] U.S. Cl. ................................ 365/218; 365/230.03
[58] Field of Search .............. 365/218, 230.03, 230.06, 365/238.5

[56] References Cited

U.S. PATENT DOCUMENTS

| | | | |
|---|---|---|---|
| 4,789,967 | 12/1988 | Liou et al. | 365/218 |
| 4,879,686 | 11/1989 | Suzuki et al. | 365/218 |
| 4,890,263 | 12/1989 | Little | 365/218 |

Primary Examiner—Stuart N. Hecker
Assistant Examiner—Michael A. Whitfield
Attorney, Agent, or Firm—Finnegan, Henderson, Farabow, Garrett and Dunner

[57] ABSTRACT

A semiconductor memory device includes a first memory cell array and a second memory cell array section into which the same data can be simultaneously written. Logic gates are provided between the word lines of the first memory cell array section and the respective word lines of the second memory cell array section. In the normal operation mode, the logic gates connect each of the rows of memory cells in the first memory cell array section to a corresponding one of the rows of memory cells in the second memory cell array section, and set each of the rows of memory cells in the second memory cell array section to a selected level when the same data is simultaneously written into the memory cells of the second memory cell array section. When each of the rows of memory cells in the second memory cell array section is set to the selected level, all the columns of the memory cells in the second memory cell array section are simultaneously selected and the same data is simultaneously written into the second memory cell array section.

19 Claims, 9 Drawing Sheets

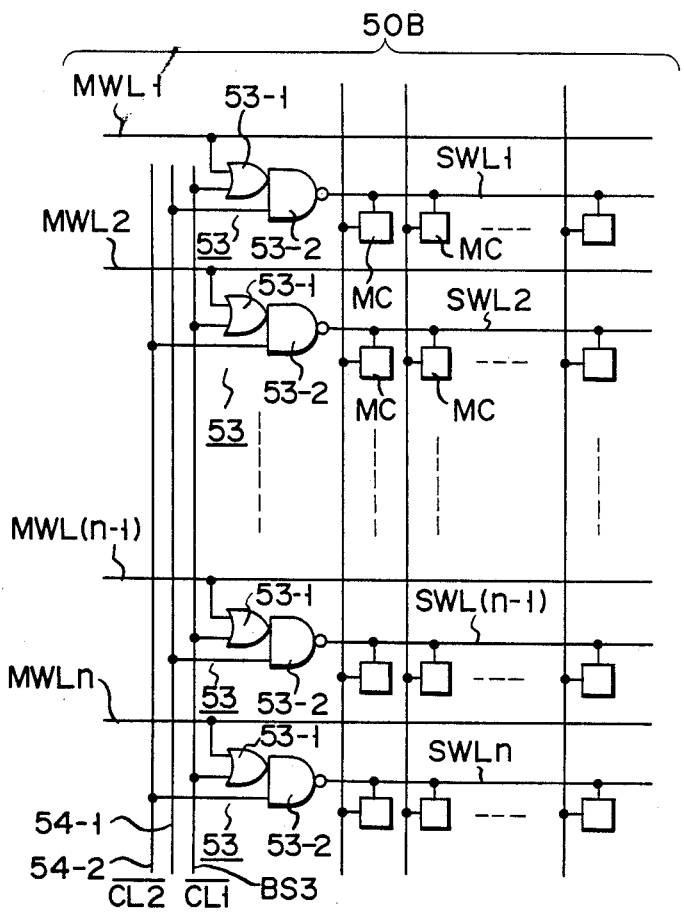
F I G. 12
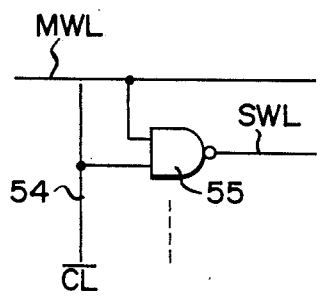
F I G. 13
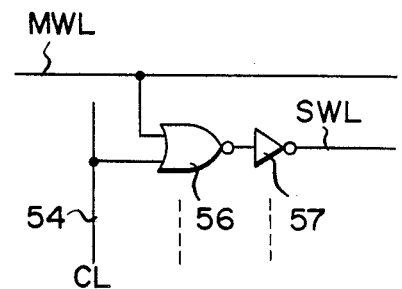
F I G. 14

SEMICONDUCTOR MEMORY DEVICE HAVING A FUNCTION OF SIMULTANEOUSLY CLEARING PART OF MEMORY DATA

BACKGROUND OF THE INVENTION

1. Field of the Invention

This invention relates to a semiconductor memory device, and more particularly to a semiconductor memory device having a function of simultaneously clearing or presetting part of memory data.

2. Description of the Related Art

It is known that some conventional systems using semiconductor memory devices have a function of simultaneously clearing or presetting all the memory data. For example, in the image memory, such a function is frequently required, and the semiconductor memory devices having the above function are widely used.

However, in order to simultaneously clear the memory data of all the memory cells to "0" or preset them to "1", it is necessary to simultaneously set all the word lines into the selected state or to "1" level. For this reason, the current consumption will increase, and the peak current will increase, thereby generating the power source noise. The power source noise will affect peripheral circuits of the memory device and various devices in the system. Further, in order to simultaneously set all the word lines into the selected state, it is necessary to provided an additional circuit in the output stage of row decoder. The presence of the additional circuit causes the operation speed in the normal operation mode (in which a specified one of the memory cells is selected and data is written into or read out from the selected memory cell) to be delayed.

In the system using the semiconductor memory device, it is sometimes required to simultaneously clear the memory data of not all but part of the memory area to "0" or preset them to "1" at a high speed. For example, in the cache memory, it is necessary to clear valid bits in the tag section to "0" at the starting time of the system operation and specify that the contents of the cache memory are not correct in the initial condition. However, the prior art system using the semiconductor memory device cannot satisfy the above requirements.

SUMMARY OF THE INVENTION

Accordingly, an object of this invention is to provide a semiconductor memory device having a function of simultaneously clearing or presetting data of part of the memory area at a high speed without causing an erroneous operation due to occurrence of power source noise and lowering the operation speed of the normal operation.

According to one embodiment of this invention, a semiconductor memory device is provided which comprises a first memory cell array section having memory cells arranged in a matrix form; a row decoder for selecting rows of the memory cells in the first memory cell array section; a first column decoder for selecting columns of the memory cells in the first memory cell array section; a second memory cell array section having memory cells arranged in a matrix form whose rows correspond to those of the first memory cell array section; a second column decoder for selecting columns of the memory cells in the second memory cell array section; and logic gates each provided between corresponding rows of the memory cells of the first and second memory cell array sections.

With the above construction, each of the rows of the memory cells of the first memory cell array section is connected to a corresponding one of the rows of the memory cells of the second memory cell array section via the logic gates in the normal operation so as to permit an output from the row decoder to be transmitted to the second memory cell array section. When the same data is simultaneously written into each of the memory cells of the second memory cell array section, all the columns in the second memory cell array section are selected by means of the second column decoder and all the rows of the memory cells in the second memory cell array section are set to a selection level by means of the logic gates.

As a result, data of partial area (second memory cell array section) of the memory are can be simultaneously cleared or preset at a high speed. At this time, since another area (first memory cell array section) of the memory cell array is not activated, the current consumption can be suppressed to a small, value in comparison with the case wherein the total area of the memory cell array is simultaneously selected and increase in the peak current can be suppressed. Therefore, the peripheral circuit of the memory device and other devices in the system will not be erroneously operated by the power source noise. Further, since it is not necessary to provide an additional circuit in the output stage of the row decoder, the operation speed in the normal operation mode will not be lowered.

Therefore, a semiconductor memory device can be provided which has a function of simultaneously clearing or presetting data of a partial area of the memory area at a high speed without causing the erroneous operation by the power source noise and lowering the operation speed in the normal operation mode.

BRIEF DESCRIPTION OF THE DRAWINGS

FIG. 12 is a circuit diagram showing the construction of a modification of the memory cell array shown in FIG. 11;

FIGS. 13 and 14 are logic gate circuit diagrams each showing another construction of the logic gate in the memory cell array shown in FIG. 11.

DETAILED DESCRIPTION OF THE PREFERRED EMBODIMENTS

Figure 1:
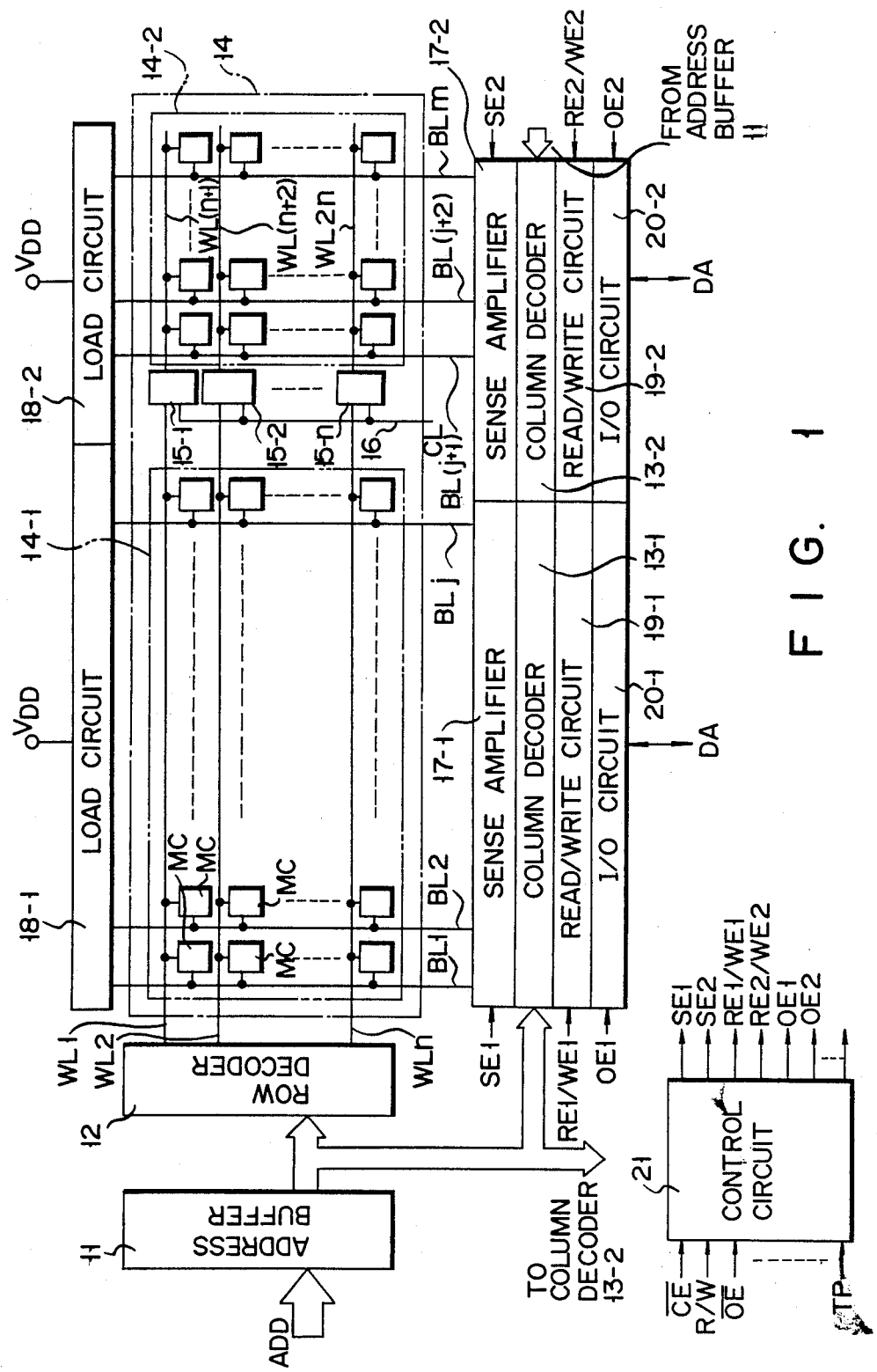
FIG. 1 is a block diagram showing the construction of a semiconductor memory device according to a first embodiment of this invention.
Figure 2:
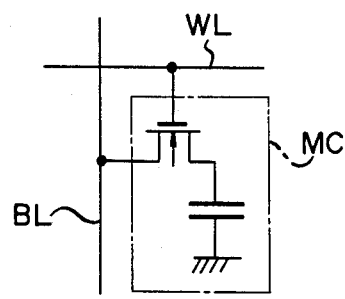
FIG. 2 is a circuit diagram showing the construction of a in the circuit of FIG. 1.
Figure 3:
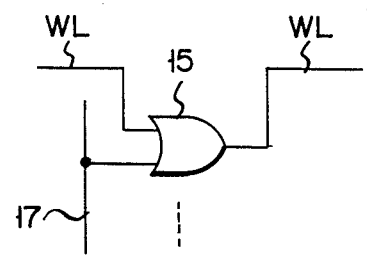
FIG. 3 is a logic circuit diagram showing an example of a logic gate used in the circuit of FIG. 1.

FIG. 1 is a block diagram showing a semiconductor memory device according to a first embodiment of this invention. Address signal ADD is supplied to address buffer 11. A row address signal included in address signal ADD temporarily stored in address buffer 11 is supplied to row decoder 12. A column address signal included in address signal ADD temporarily stored in address buffer 11 is supplied to column decoders 13-1 and 13-2. Column decoder 13-2 has a function of simultaneously selecting all the columns in addition to a normal function of decoding the column address signal to select one of the columns. A decoded output of the row address signal from row decoder 12 is supplied to memory cell array 14 via word lines WL1 to WLn. Memory cell array 14 includes dynamic memory cells MC each of which is constituted by one transistor and one capacitor as shown in FIG. 2. Each memory cell array 14 includes normal memory cell array section 14-1 and clear memory cell array section 14-2 in which the same data can be simultaneously written in (for example, data can be simultaneously cleared). Logic gates 15-1 to 15-n are provided between memory cell array section 14-1 and clear memory cell array section 14-2. One input terminal of each of logic gates 15-1 to 15-n is connected to a corresponding one of word lines WL1 to WLn of memory cell array section 14-1, and the other input terminal thereof is connected to control signal line 16 to which clear signal CL is supplied from the outside of the memory device. The output terminals of logic gates 15-1 to 15-n are respectively connected to word lines WL(n+1) of clear memory cell array section 14-2. As shown in FIG. 3, for example, each of logic gates 15-1 to 15-n is constituted by OR gate 15.

A decoded output of the column address signal from column address decoder 13-1 is supplied to memory cell array section 14-1 via sense amplifier 17-1 and bit lines BL1 to BLj. A decoded output of the column address signal from column address decoder 13-2 is supplied to memory cell array section 14-2 via sense amplifier 17-2 and bit lines BL(j+1) to BLm. Load circuit 18-1 is connected between memory cell array section 14-1 and power source $V_{DD}$, and load circuit 18-2 is connected between clear memory cell array section 14-2 and power source VDD. Read/write circuits 19-1 and 19-2 are respectively connected to column decoders 13-1 and 13-2 so as to read out data stored in memory cell array sections 14-1 and 14-2 or write externally supplied data into the memory cell array sections. Input/output circuits 20-1 and 20-2 are connected to read/write circuits 19-1 and 19-2 to input or output data. The memory data is output from any selected memory cell MC via bit lines BL1 to BLm, sense amplifiers 17-1 and 17-2, read/write circuits L9-1 and 19-2, and I/0 circuits 20-1 and 20-2. Further, write-in data DA is written into memory cells MC selected by row decoder 12 and column decoder 13-1 or 13-2 via I/0 circuits 20-1 and 20-2, read/write circuits 19-1 and 19-2, sense amplifiers 17-1 and 17-2, and bit lines BL1 to BLm.

Control circuit 21 effects the entire control operation of the memory device. Control circuit 21 is supplied with chip enable signal $\overline{CE}$, read/write signal R/W, output enable signal $\overline{OE}$, timing pulse TP and the like from the exterior. The operation of sense amplifier 16-1 is controlled by sense amplifier enable signal SE1 sense amplifier 16-2 is controlled by sense amplifier enable signal SE2. Further, the operation of read/write circuit 19-1 is controlled by read-enable/write enable-signal RE1/WE1 output from control circuit 21, and the operation of read/write circuit 19-2 is controlled by read-enable/write-enable signal RE2/WE2. The operation of I/O circuit 20-1 is controlled by output enable signal OE1 output from control circuit 21, and the operation of I/O circuit 20-2 is controlled by output enable signal OE2.

There will now be described the operation of the semiconductor memory device shown in FIG. 1. In the normal operation mode, clear signal CL supplied to control signal line 16 is set to "0" level. A decoded signal supplied from row decoder 12 to word lines WL1 to WLn of memory cell array section 14-1 is further supplied to word lines WL(n+1) to WL2n of clear memory cell array section 14-2 via logic gates 15-1 to 15-n. In other words, word lines WL1 to WLn are respectively connected to word lines WL(n+1) to WL2n. In this way, the normal operation can be effected in which one of memory cells MC is selected and data can be read out from or written into the selected memory cell.

The normal write-in operation is effected as follows. First, when chip enable signal $\overline{CE}$ is set to "0" level, the memory device is set into the enable condition under the control of control circuit 21. When read/write signal R/W is set to the write mode, sense amplifier enable signals SE1 and SE2 and write enable signals WE1 and WE2 are output from control circuit 21. As a result, sense amplifiers 17-1 and 17-2 are set into the enable state and read/write circuits 19-1 and 19-2 are set into the write-in state. Further, I/O circuits 20-1 and 20-2 are set into the input state by output enable signals OE1 and OE2 output from control circuit 21. Then, address signal ADD is supplied to address buffer 11, a row address signal included in the address signal temporarily stored in address buffer 11 is supplied to row decoder 12, and a column address signal is supplied to column decoders 13-1 and 13-2. One of word lines WL1 to WLn is selected by means of row decoder 12, and one of bit lines BL1 to BLm is selected by means of column decoders 13-1 and 13-2. When one of word lines WL1 to WLn is selected, one of word lines WL(n+1) to WL2n corresponding to the selected word line (or connected to the selected word line via logic gate 15) is also selected. As a result, memory cell MC in memory cell array 14 arranged in a position at which selected word line WL and selected bit line BL intersect is selected. Data DA is written into selected memory cell MC via I/O circuits 20-1 and 20-2, read/write circuits 19-1 and 19-2, sense amplifiers 17-1 and 17-2, and bit lines BL1 to BLm.

The normal readout operation is effected as follows. When read/write signal R/W is set to the read mode, sense amplifier enable signals SE1 and SE2 and read enable signals RE1 and RE2 are output from control circuit 21. As a result, sense amplifiers 17-1 and 17-2 are set into the enable state and read/write circuits 19-1 and 19-2 are set into the readout state. Further, output enable signals OE1 and OE2 are output from control circuit 21 to set I/O circuits 20-1 and 20-2 into the output state. Then, address signal ADD is supplied to address buffer 11, a row address signal included in the address signal temporarily stored in address buffer 11 is supplied to row decoder 12, and a column address signal is supplied to column decoders 13-1 and 13-2. One of word lines WL1 to WLn and one of word lines WL(n+1) to WL2n corresponding to the selected word line are selected by means of row decoder 12, and one of bit lines BL1 to BLm is selected by means of column decoders 13-1 and 13-2. As a result, memory cell MC in memory cell array 14 is selected. Data stored in selected memory cell MC is output via bit lines BL1 to BLm, sense amplifiers 17-1 and 17-2, read/write circuits 19-1 and 19-2, and I/O circuits 20-1 and 20-2.

The clearing operation of simultaneously clearing memory cells MC in clear memory cell array section 14-2 is effected as follows. First, clear signal CL supplied to control signal line 16 is set to "1" level. As a result, output signals of logic gates 15-1 to 15-n are set to "1" level, and the potentials of word lines WL(n+1) to WL2n are all set to "1" level irrespective of an output of row decoder 12. Immediately before clear signal CL is set to "1" level, all the bit lines BL(j+1) to BLm are simultaneously selected by means of column decoder 13-2. Read/write circuit 19-2 is set into the write mode by write enable signal WE2 output from control circuit 21. Then, a "0" level signal is simultaneously written as write-in data into each memory cell MC of clear memory cell array section 14-2 via I/O circuit 20-2, read/write circuit 19-2, and sense amplifier 17-2. Thus, all the memory data of memory cells MC in clear memory cell array section 14-2 are simultaneously cleared.

At this time, word lines WL1 to WLn of normal memory cell array section 14-1 are not activated. Therefore, unwanted current is not consumed in memory cell array section 14-1, lowering increase in the peak current and suppressing occurrence of the power source noise. Thus, the peripheral circuits of the memory device and other devices of the system may be prevented from being erroneously operated. Further, since it is not necessary to provide an additional circuit in the output stage of row decoder 12 the operation speed in the normal operation mode will not be lowered.

In a case where all the memory data in clear memory cell array section 14-2 is preset to "1" level, all the bit lines BL(j+1) to BLm are selected by means of column decoder 13-2 immediately before clear signal CL is set to "1" level. Then, a "1" level signal is simultaneously written as written-in data into each memory cell MC of clear memory cell MC of clear memory cell array section 14-2 via I/O circuit 20-2, read/write circuit 19-2 and sense amplifier 17-2. In this case, the same effect as that obtained in the above-described simultaneous clearing operation can be attained.

Figure 4:
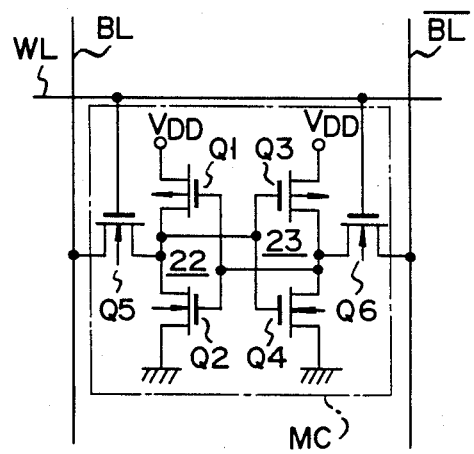
FIGS. 4 and 5 are circuit diagrams each showing another construction of a memory cell used in the circuit of FIG. 1.
Figure 5:
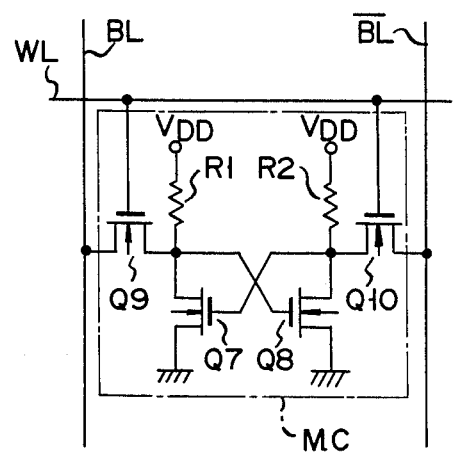

In the above explanation, memory cells MC are assumed to be dynamic type, but it can also be applied to static memory cells as shown in FIG. 4 or 5. In FIG. 4, memory cell MC is constituted by six MOS transistors Q1 to Q6. P-channel MOS transistor Q1 and N-channel MOS transistor Q2 are combined to form CMOS inverter 22. P-channel MOS transistor Q3 and N-channel MOS transistor Q4 are combined to form CMOS inverter 23. An input terminal of CMOS inverter 22 is connected to an output terminal of CMOS inverter 23, and an output terminal of CMOS inverter 22 is connected to an input terminal of CMOS inverter 23 to constitute a latch circuit. The current path between the source and drain of transfer N-channel MOS transistor Q5 is connected between the output terminal of CMOS inverter 22 and bit line BL. The current path between the source and drain of transfer N-channel MOS transistor Q6 is connected between the output terminal of CMOS inverter 23 and bit lines $\overline{BL}$. The gate electrodes of MOS transistors Q5 and Q6 are connected to word line WL.

Memory cell shown in FIG. 5 includes N-channel MOS transistors Q7 to Q10 and two load resistors R1 and R2. One end of resistor R1 is connected to power source $V_{DD}$ and the other end thereof is connected to one end of the current path of MOS transistor Q7 and the gate electrode of MOS transistor Q8. One end of resistor R2 is connected to power source $V_{DD}$ and the other end thereof is connected to one end of the current path of MOS transistor Q8 and the gate electrode of MOS transistor Q7. The other end of each of MOS transistors Q7 and Q8 is grounded. Further, one end of the current path of transfer MOS transistor Q9 is connected to a connection node between resistor R1 and MOS transistor Q7, and the other end thereof is connected to bit line BL. One end of the current path of transfer MOS transistor Q10 is connected to a connection node between resistor R2 and MOS transistor Q8, and the other end thereof is connected to bit line $\overline{BL}$.

In a case where memory cell MC of the construction shown in FIG. 4 or 5 is used in the circuit of FIG. 1, basically the same effect and operation as those obtained in the dynamic memory cell can be attained. In this case, however, it is necessary to use two bit lines instead of one bit line, that is, a pair of bit lines BL and $\overline{BL}$ to which signals in the inverted phase relation are supplied.

Figure 6:
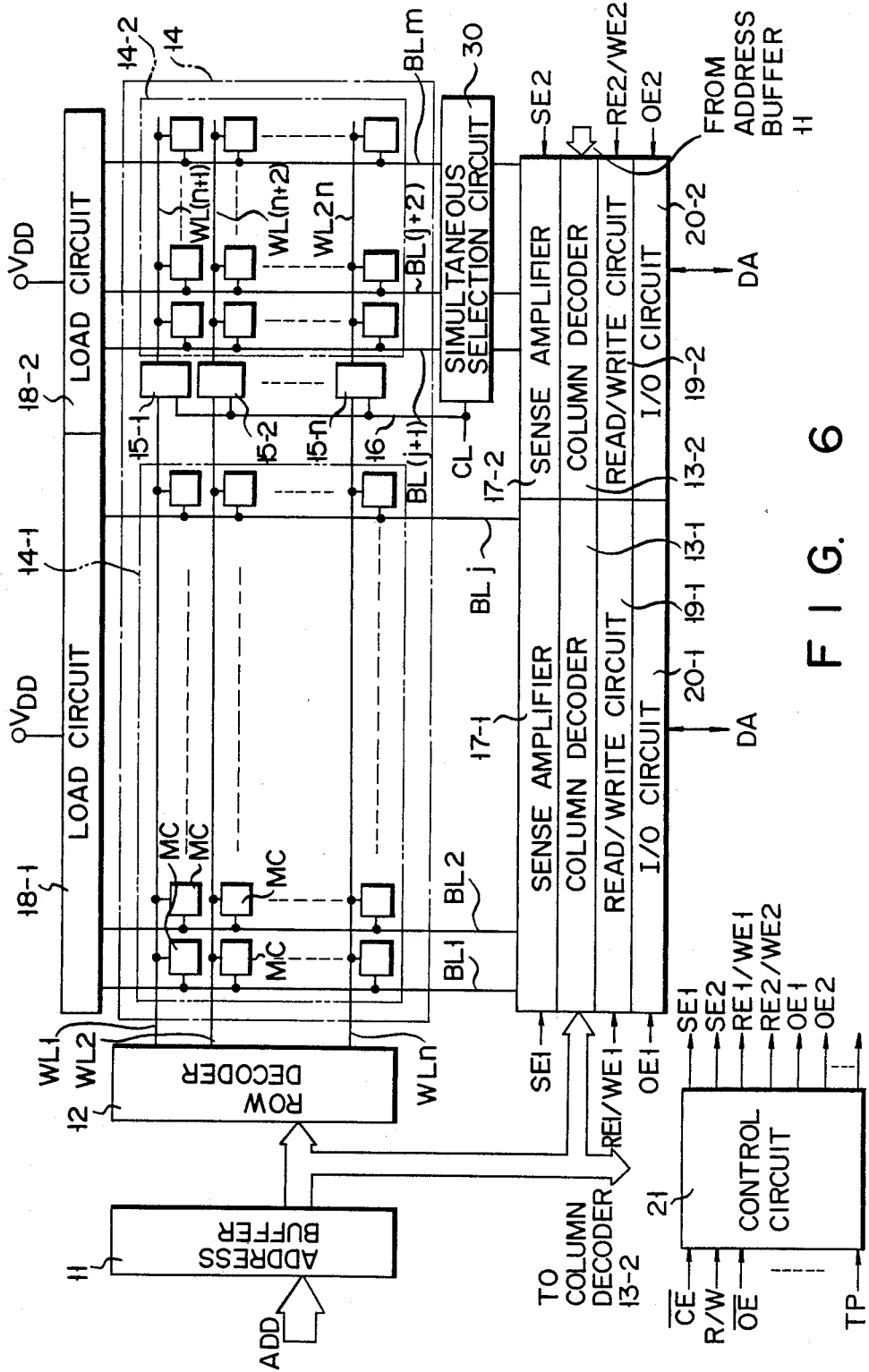
FIG. 6 is a block diagram showing the modification of the semiconductor memory device shown in FIG. 1.

FIG. 6 shows a modification of the semiconductor memory device shown in FIG. 1. In the circuit of FIG. 6, simultaneous selection circuit 30 for simultaneously selecting bit lines BL(j+1) to BLm is additionally provided in the circuit of FIG. 1. In this case, it is not necessary for column decoder 13-2 to have a function of simultaneously selecting bit lines BL(j+1) to BLm. Since the other construction is the same as that of the circuit of FIG. 1, the same parts as those of the circuit of FIG. 1 are denoted by the same reference numerals and the explanation thereof by the same reference numerals and the explanation thereof is omitted. Simultaneous selection circuit 30 is used to simultaneously set bit lines BL(j+1) to BLm to "0" or "1" level based on the level of clear signal CL.

Figure 7:
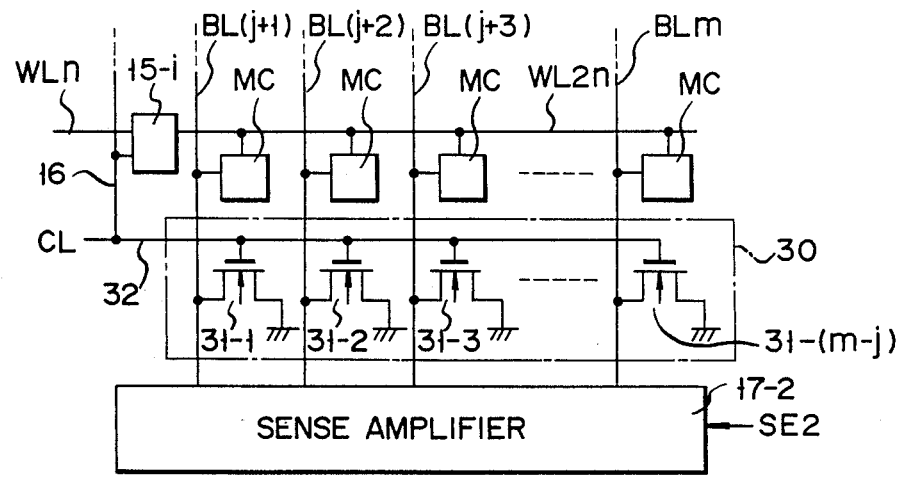
FIGS. 7 and 8 are circuit diagrams showing the construction of a simultaneous selection circuit used in the circuit of FIG. 6.

FIG. 7 shows the detail circuit construction of simultaneous selection circuit 30 in the circuit of FIG. 6. The current paths between the sources and drains of N-channel MOS transistors 31-1 to 31-(m-j) are connected between bit lines BL(j+1) to BLm and the ground terminal. The gate electrodes of MOS transistors 31-1 to 31-(m-j) are connected to control signal line 32 to which clear signal CL is supplied.

With the above construction, since all the MOS transistors 31-1 to 31-(m-j) are set in the OFF state when clear signal CL is set at "0" level, simultaneous selection circuit 30 will not affect the operation of the memory device. In contrast, when clear signal CL is set to "1" level, MOS transistors 31-1 to 31-(m-j) are turned on and bit lines BL(j+1) to BLm are discharged, thus setting the potentials thereof to "0" level. At this time, since outputs of logic gates 15-1 to 15-n are set to "1" level, all the memory cells MC of clear memory cell array section 14-2 are selected and memory data in memory cells MC are simultaneously cleared to "0".

Figure 8:
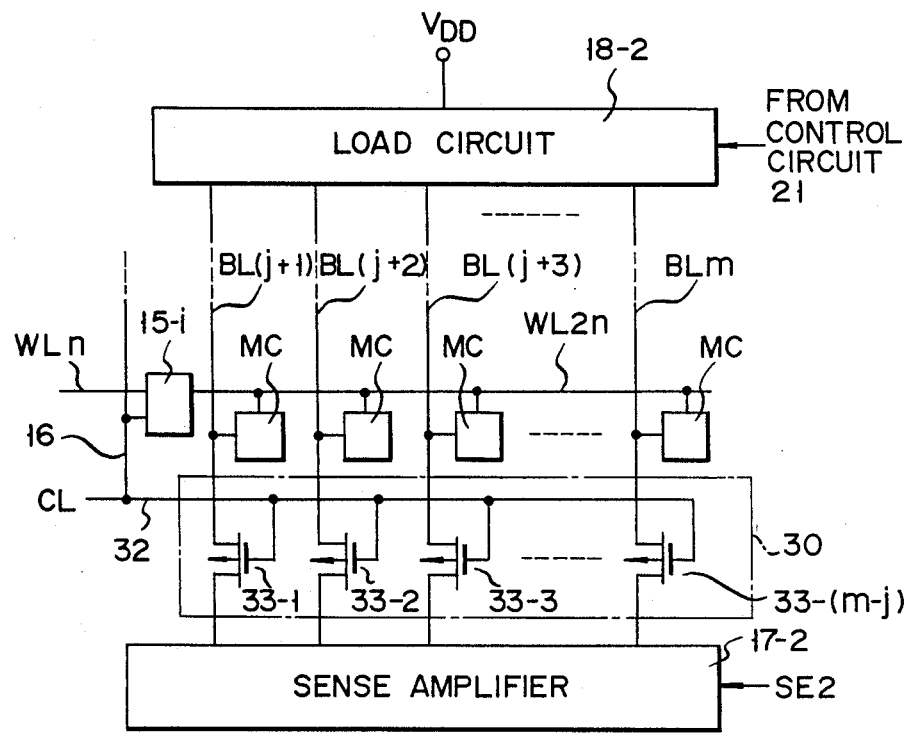

FIG. 8 shows another detail circuit construction of simultaneous selection circuit 30 in the circuit of FIG. 6. The circuit of FIG. 8 is used to simultaneously preset clear memory cell array section 14-2 to "1" level. The current paths between the sources and drains of P-channel MOS transistors 33-1 to 33-(m-j) are connected in series with bit lines BL(j+1) to BLm. The gate electrodes of MOS transistors 33-1 to 33-(m-j) are connected to control signal line 32 to which clear signal CL is supplied.

With the above construction, since MOS transistors 33-1 to 33-(m-j) are all set il the ON state when clear signal CL is at "0" level, simultaneous selection circuit 30 will not affect the operation of the memory device. In contrast, when CL is set to "1" level, MOS transistors 33-1 to 33-(m-j) are set to the OFF state, separating bit lines BL(j+1) to BLm from sense amplifier 17-2. At this time, load circuit 18-2 is controlled by means of control circuit 21 (or load circuit 18-2 may be controlled by the level of clear signal CL) to precharge bit lines BL(j+1) to BLm to "1" level. Since, at this time, outputs of logic gates 15-1 to 15-n are set to "1" level, all the memory cells MC in clear memory cell array section 14-2 area selected. The memory data stored in memory cells MC are simultaneously preset to "1" level.

Figure 9:
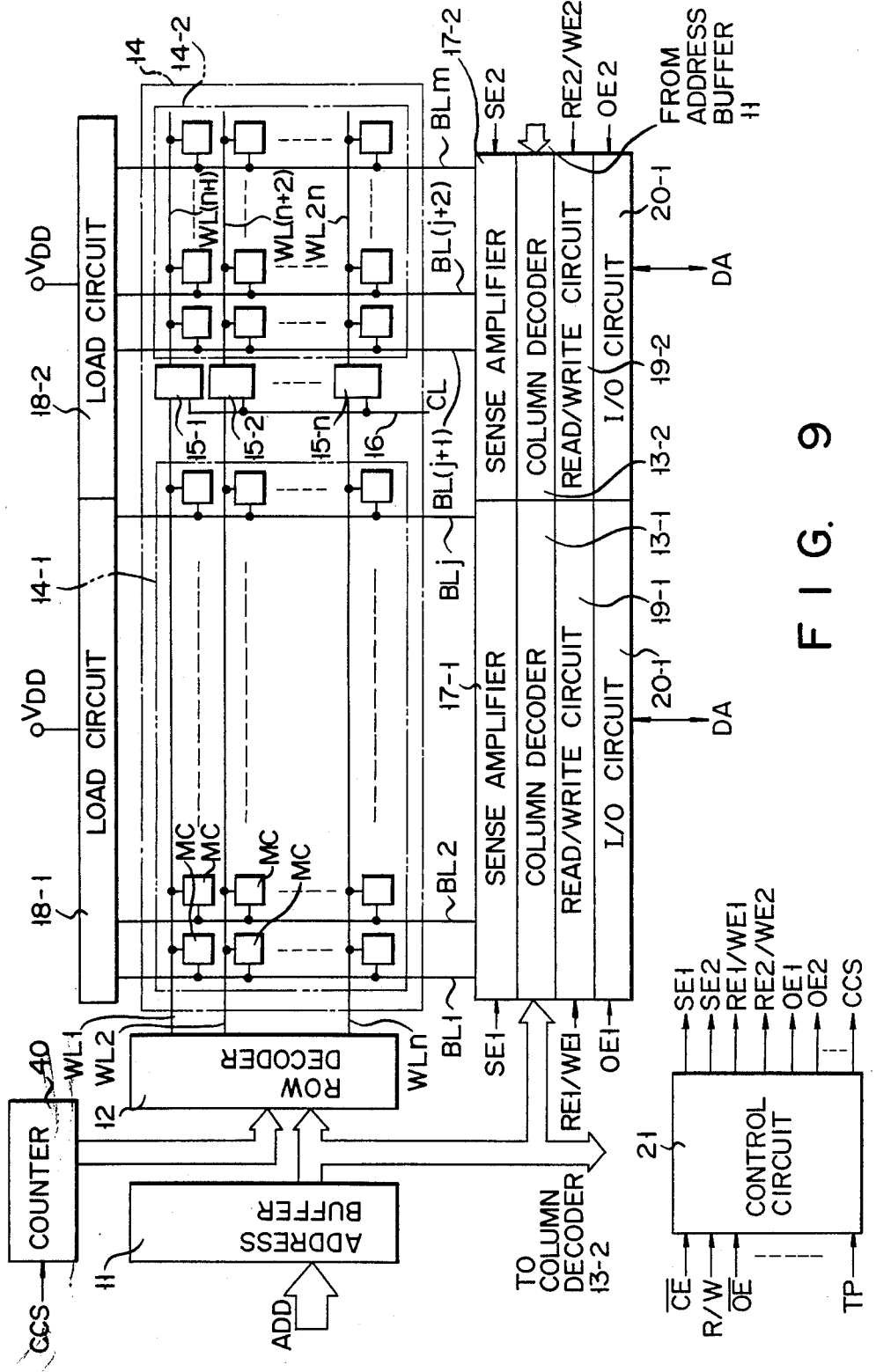
FIGS. 9 and 10 are block diagrams showing the modifications of the semiconductor memory device shown in FIG. 1.

FIG. 9 shows the construction of a modification of the circuit shown in FIG. 1. In FIG. 9, the same parts as those of the circuit shown in FIG. 1 are denoted by the same reference numerals, and the explanation thereof is omitted. In this case, counter 40 for sequentially specifying addresses of memory cell array section 14-1 for each row is additionally provided in the circuit of FIG. 1. The operation of counter 40 is controlled by counter control signal CCS supplied from control circuit 21. An output signal of counter 40 is supplied to row decoder 12.

With the above construction, the read/write operation and the simultaneous clearing (or presetting) operation are effected in the same manner as described with reference to FIG. 1. In addition to the above operation, the operation of sequentially clearing (or presetting) memory cell array section 14-1 may be performed for each word line WL in the circuit of FIG. 9. That is, counter 40 counts down or counts up the count value according to counter control signal CCS supplied from control circuit 21. The count value is supplied as a row address signal to row decoder 12 and word lines WLI to WLn are sequentially selected. At this time, all the bit lines BL1 to BLj are selected by an output of column decoder 13-1. In this condition, a "1" or "0" level signal is written as input data into memory cell MC connected to a selected one of the word lines. The same operation is effected for each word line to clear or preset data in memory cell array section 14-1 for each word line WL.

Figure 10:
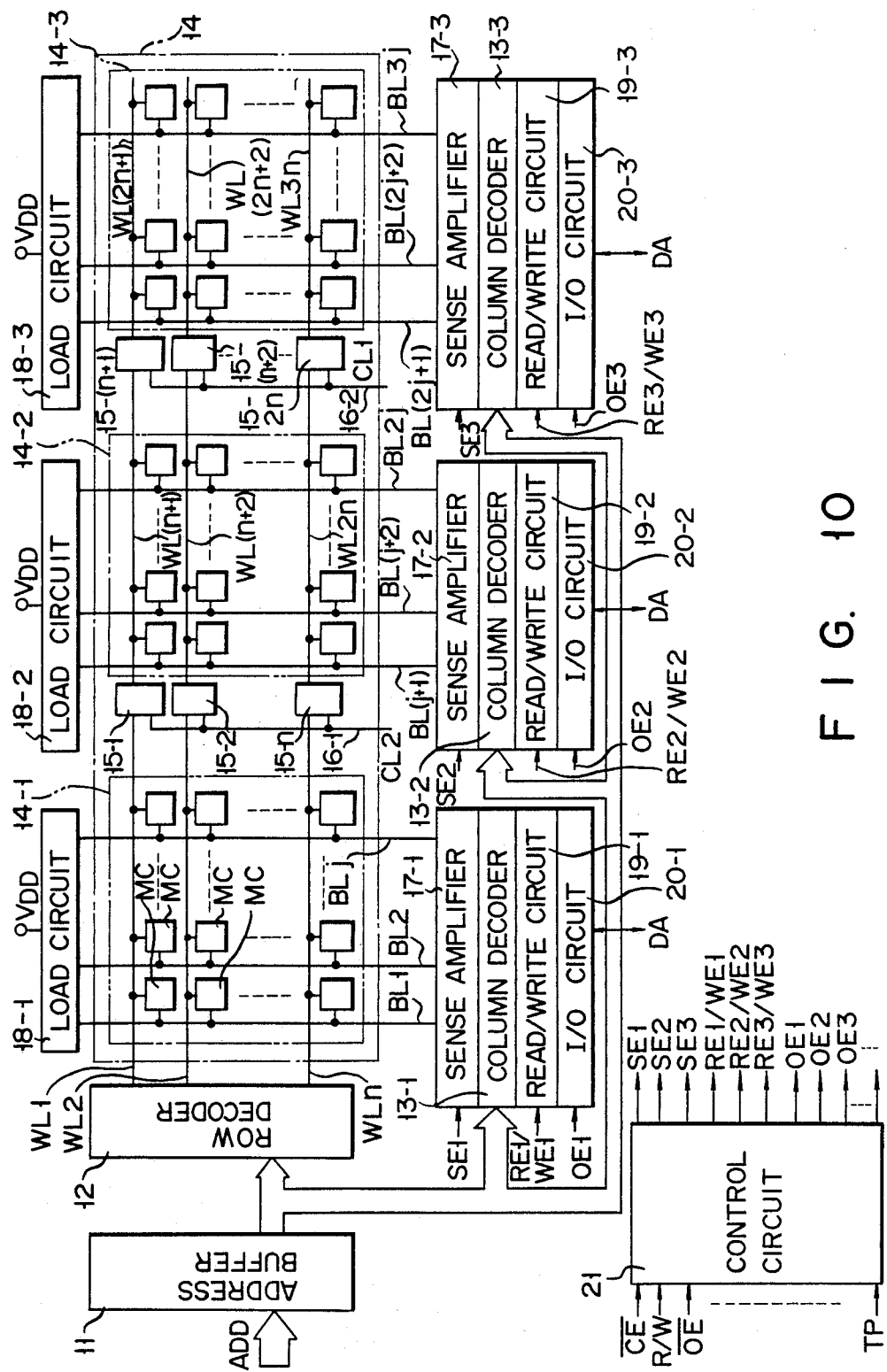

FIG. 10 shows the construction of a modification of the memory device shown in FIG. 1. In the memory device, memory cell array 14 is divided into three memory areas, that is, normal memory cell array section 14-1, and clear memory cell array sections 14-2 and 14-3 in each of which data can be simultaneously cleared or preset. Logic gates 15-1 to 15-n are provided between memory cell array section 14-1 and clear memory cell array section 14-2, and logic gates 15-(n+1) to 15-2n are provided between clear memory cell array sections 14-2 and 14-3. Each of logic gates 15-1 to 15-2n is formed of an OR gate as shown in FIG. 3, for example. A first input terminal of each of logic gates 15-1 to 15-n is connected to a corresponding one of word lines WL1 to WLn, a second input terminal thereof is connected to control signal line 16-1 to which clear signal CL1 is supplied, and an output terminal thereof is connected to a corresponding one of word lines WL(n+1) to WL2n. A first input terminal of each of logic gates 15-(n+1) to 15-2n is connected to a corresponding one of word lines WL(n+1) to WL2n, a second input terminal thereof is connected to control signal line 16-2 to which clear signal CL2 is supplied, and an output terminal thereof is connected to a corresponding one of word lines WL(2n+1) to WL3n. Sense amplifiers 17-1 to 17-3, column decoders 13-1 to 13-3, read/write circuits 19-1 to 19-3 and output circuits 20-1 to 20-3 which are controlled by output signals of control circuit 21 are respectively provided for memory cell array sections 14-1 to 14-3.

The circuit with the above construction is similar to the circuit of FIG. 1 except that the simultaneous clearing operation is effected with respect to two clear memory cell array sections 14-L and 14-3. In the normal operation mode, clear signals CL1 and CL2 are set to "0" level. Therefore, logic gates 15-1 to 15-n permit the potentials of word lines WL1 to WLn to be transmitted to word lines WL(n+1) to WL2n, and logic gates 15-(n+1) to 15-2n permit the potentials of word lines WL(n+1) to WL2n to be transmitted to word lines WL(2n+1) to WL3n. As a result, one of memory cells MC in memory cell array 14 can be selected, and the normal write-in or readout operation is effected with respect to the selected memory cell.

The simultaneous clearing (or presetting) operation is effected as follows. First, clear signal CL1 is set to "1" level (clear signal CL2 is set at "0" level) to simultaneously select and set word lines WL(2n+1) to WL3n to "1" level. At this time, bit lines BL(2j+1) to BL3j are simultaneously selected by column decoder 13-3 under the control of control circuit 21. In this condition, a "0" level signal is written as write-in data into each of memory cells MC of clear memory cell array section 14-3, thus simultaneously clearing the entire portion of clear memory cell array section 14-3 to "0" level. Further, when a "1" level signal is written as input data into each of memory cells MC of clear memory cell array section 14-3, the entire portion of clear memory cell array section 14-3 is preset to "1" level at the same time.

Next, clear memory cell array section 14-2 is cleared as required. In this case, clear signal CL2 is set to "1" level so as to simultaneously select and set word lines WL(n+1) to WL2n to "1" level. At this time, bit lines BL(j+1) to BL2j are simultaneously selected by column decoder 13-2 under the control of control circuit 21. If, in this condition, "0" level signal is written as input data into each memory cell MC in clear memory cell array section 14-2, the entire portion of clear memory cell array section 14-2 is simultaneously cleared to "0" level. In contrast, if "1" level signal is written as input data into each memory cell MC in clear memory cell array section 14-2, the entire portion of clear memory cell array section 14-2 is simultaneously preset to "1" level.

The circuit with the above construction is similar to the circuit of FIG. 1 except that the clear memory cell array section is additionally provided, and basically the same operation and effect as those obtained in the circuit of FIG. 1 can be attained.

In the circuit of FIG. 10, two clear memory cell array sections are used, but it is of course possible to use more than two clear memory cell array sections. In this case, it is possible to control the clear memory cell array sections so as to individually clear the clear memory cell array sections, or simultaneously clear odd numbered ones or even numbered ones of the clear memory cell array sections by using two clear signals. Further, it is possible to divide the clear memory cell array sections into upper and power groups and control the two groups of clear memory cell array sections by using two clear signals. It is also possible to divide the clear memory cell array sections into three or more groups and selectively clear or preset them.

Figure 11:
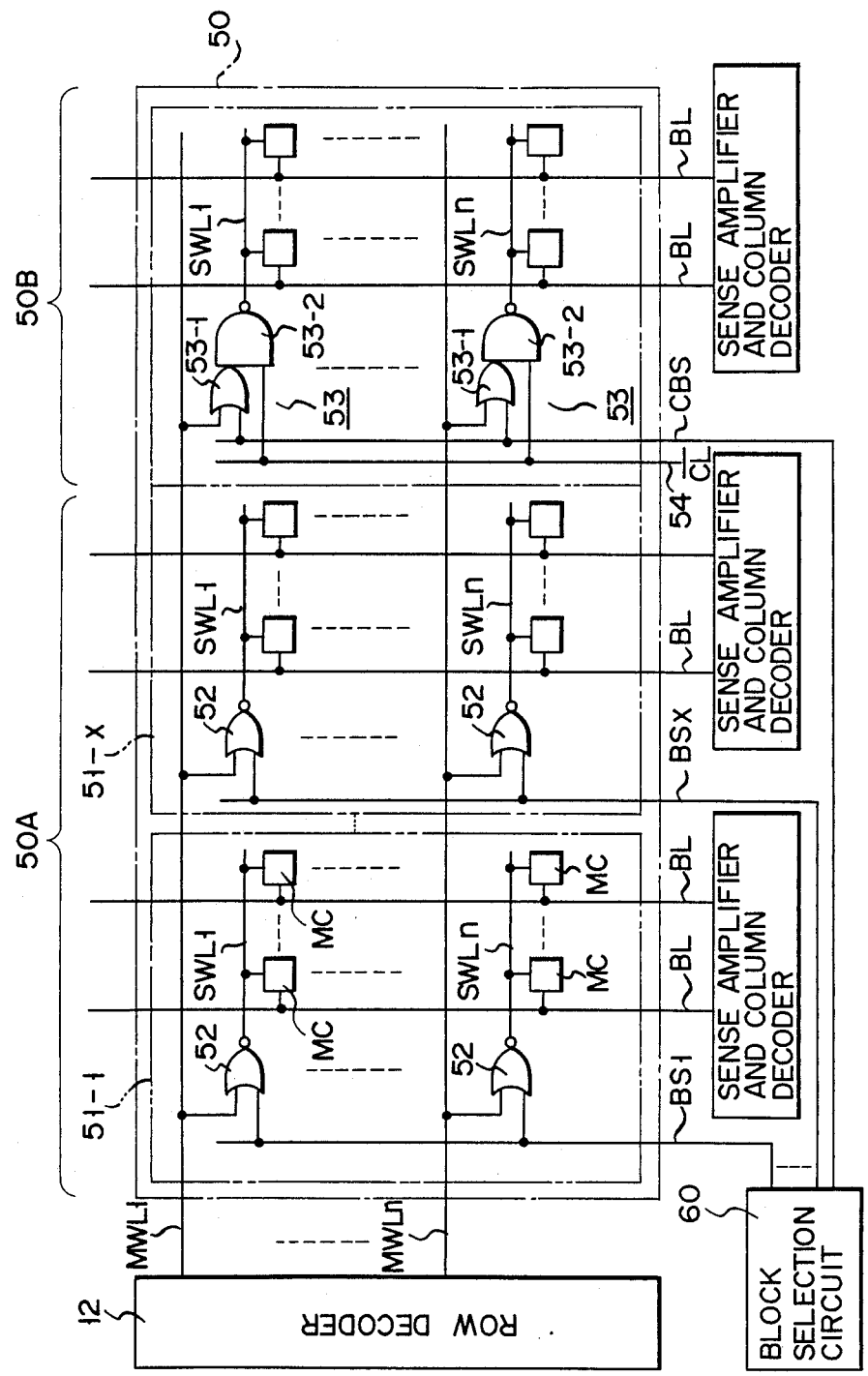
FIG. 11 is a circuit diagrams showing the memory cell array and the peripheral circuit thereof semiconductor memory device according to a second embodiment of this invention.

FIG. 11 shows the construction of a memory cell array in a semiconductor memory device according to a second embodiment of this invention. In this embodiment, each of the rows in the memory cell array is selected by use of dual word lines. The semiconductor memory device in which the dual word lines are used for selection is disclosed in U.S. Pat. No. 4,618,945 by the inventors of this application and others. The contents of U.S. Pat. No. 4,618,945 are hereby expressly incorporated by reference into this application, and the detail explanation of the dual word line system is omitted.

Memory cell array 50 includes normal memory cell array section 50A and clear memory cell array section 50B which can be simultaneously cleared or preset. Memory cell array section 50A is divided into a plurality of blocks 51-1 to 51-x which each include a plurality of columns, and common main word lines MWL1 to MWLn are provided for respective rows of blocks 51-1 to 51-x and clear memory cell section 50B. Sub-word lines SWL1 to SWLn are provided for respective rows of blocks 51-1 to 51-x and clear memory cell array section 50B. Further, block selection lines BS1 to BSx and clear block selection line CBS for selecting each block are respectively provided in block 51-1 to 51-x and clear memory cell array section 50B to extend in a direction intersecting word lines MWL1 to MWLn. An output of block selection circuit 60 is supplied to block selection lines BS1 to BSx and clear block selection line CBS. One input terminal of logic gate (for example, NOR gate) 52 is connected to main word line MWL, the other input terminal thereof is connected to block selection line BS, and the output terminal thereof is connected to sub-word line SWL. Memory cells MC are connected to sub-word lines SWL1 to SWLn and bit lines BL. Logic gate 53 is constituted to include OR gate 53-1 and NAND gate 53-2. One input terminal of OR gate 53-1 is connected to main word line MWL, the other input terminal thereof is connected to clear block selection line CBS, and the output terminal thereof is connected to one input terminal of NAND gate 53-2. The other input terminal of NAND gate 53-2 is connected to control signal line 54 to which clear signal $\overline{CL}$ is supplied, and the output terminals thereof is connected to a corresponding one of sub-word lines SWL1 to SWLn.

Next, the operation of the circuit of the above construction is explained. First, block selection line BS1 to BSx are selectively set to the "0" level by an output of block selection circuit 60 so as to activate a corresponding one of blocks 51-1 to 51-x. Even if main word line MWL is set in the active condition (or at "0" level), memory cells MC are not activated unless the block is selected, thus making it possible to reduce the power consumption. When clear signal $\overline{CL}$ is set to "0" level, all the sub-word lines SWL1 to SWLn of clear memory cell array section 50B are set to "1" level, thereby simultaneously writing "0" into all the memory cells MC. In order to access clear memory cell array section 50B so as to effect the normal operation, clear control signal $\overline{CL}$ is set to "1" level and clear block selection signal CBS is set to "0" level (activated). As a result, when main word line MWL is selectively set to "0" level (activated), a corresponding one of sub-word lines SWL is set to "1" level.

FIG. 12 shows another construction of clear memory cell array section 50B in the circuit of FIG. 11. In the circuit of FIG. 12, two control signal lines 54-1 and 54-2 which are supplied with two clear signals $\overline{CL1}$ and $\overline{CL2}$ are provided Control signal line 54-1 is connected to logic gates 53 on the odd numbered rows, and control signal line 54-2 is connected to logic gates 53 on the even numbered rows.

With this construction, memory cells MC connected to sub-word lines SWL on the odd numbered rows are simultaneously cleared or preset rest according to the level of clear signal $\overline{CL1}$, and memory cells MC connected to subword lines SWL on the even numbered rows are simultaneously cleared or preset according to the level of clear signal $\overline{CL2}$. In a case where three or more control signal lines are provided, it is possible to divide clear memory cell array section 50B into a larger number of groups and selectively clear or preset the memory cell group at the same time.

In a memory device in which clear memory cell array section 50B of FIG. 11 is always set in the accessible condition, clear block selection signal CBS may be omitted, and a logic gate shown in FIG. 13 or 14 may be used as the logic gate on each row. The circuit of FIG. 13 includes NAND gate 55 which is supplied with signal CL of clear control signal line 54 and a signal of main word line MWL. The circuit of FIG. 14 includes NOR gate 56 which is supplied with signal $\overline{CL}$ of clear control signal line 54 and a signal of main word line MWL and inverter 57 for inverting the output of NOR gate 56.

Figure 15:
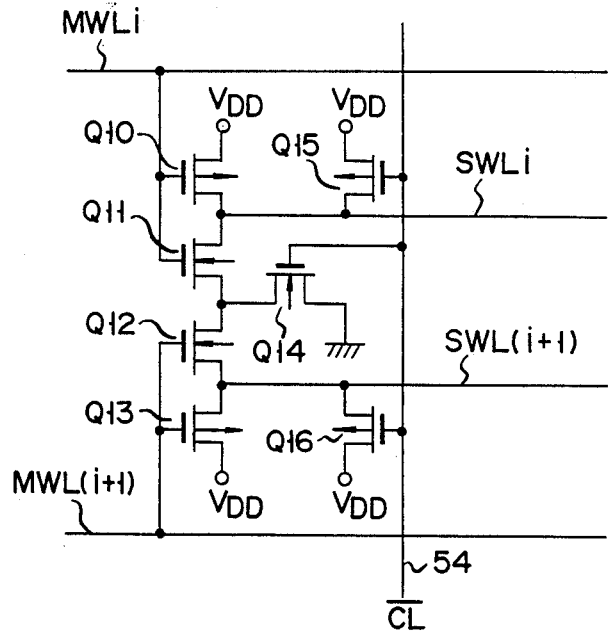
FIGS. 15 and 16 are circuit diagrams showing the detail construction of a logic circuit having the same function as the logic gate shown in FIGS. 13 and 14.
Figure 16:
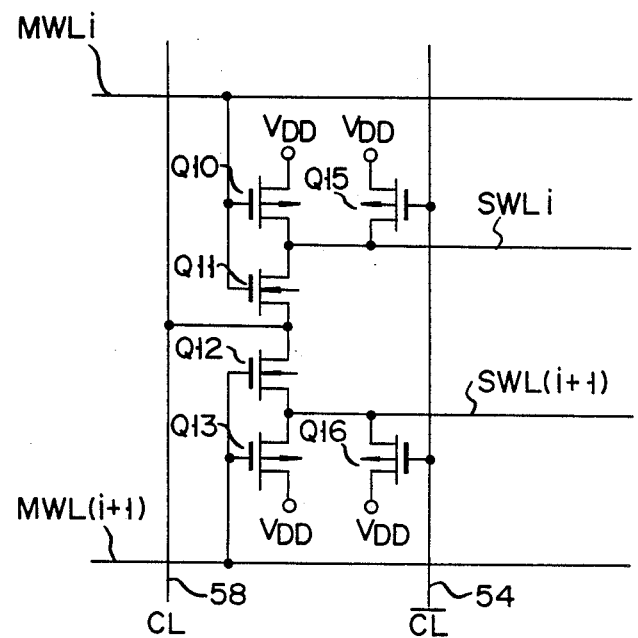

FIGS. 15 and 16 each show the detailed construction of a circuit having the same function as that of the logic gate shown in FIGS. 13 and 14. Two adjacent main word lines are commonly connected to the logic circuits. Therefore, the logic circuits can be constituted by a smaller number of elements in comparison with the logic gates shown in FIGS. 13 and 14. The logic circuit shown in FIG. 15 includes P-channel MOS transistor Q10, N-channel MOS transistors Q11 and Q12, and P-channel MOS transistor Q13 whose current paths are serially connected between power source terminals $V_{DD}$. The gates of MOS transistors Q10 and Q11 are connected to main word line MWLi, and the gates of MOS transistors Q12 and Q13 are connected to main word line MWL(i+1). One end of the current path of MOS transistor Q14 is connected to a connection node between MOS transistor Q11 and Q12, the other end thereof is grounded, and the gate thereof is connected to control signal line 54 to which clear signal $\overline{CL}$ is supplied. Further, a connection node between MOS transistors Q10 and Q11 is connected to one end of sub-word line SWLi. The current path of MOS transistor Q15 is connected between power source terminal $V_{DD}$ and sub-word line SWLi, and the gate thereof is connected to control signal line 54. Likewise, a connection node between MOS transistor Q12 and Q13 is connected to one end of sub-word line SWL(i+1). The current path of MOS transistor Q16 is connected between power source terminal $V_{DD}$ and sub-word line SWL(i+1), and the gate thereof is connected to control signal line 54.

With the above construction, when clear signal $\overline{CL}$ is set to "0" level, MOS transistors Q15 and Q16 are set into the ON state and MOS transistor Q14 is set into the OFF state. MOS transistor Q14 in the OFF state causes MOS transistors Q10 to Q13 to be set into the OFF state. As a result, sub-word line SWLi is precharged to "1" level by means of MOS transistor Q15, and sub-word line SWL(i+1) is precharged to "1" level by means of MOS transistor Q16. When clear signal $\overline{CL}$ is set at "1" level, MOS transistors Q15 and Q16 are set in OFF state and MOS transistor Q14 is set in the ON state. MOS transistor Q14 in the ON state causes MOS transistor Q10 and Q11 to function as an inverter, thereby inverting the potential of main word line MWLi and transmitting the potential to sub-word line SWLi. Further, MOS transistors Q13 and Q12 function as an inverter, and the potential of main word line MWL(i+1) is inverted and transmitted to sub-word line SWL(i+1). Therefore, the same function as that of the circuit shown in FIGS. 13 and 14 can be attained.

In the circuit of FIG. 16, the number of elements is reduced (by one MOS transistor, or MOS transistor Q14) in comparison with the circuit of FIG. 15. That is, instead of using MOS transistor Q14 in the circuit of FIG. 15, control signal line 58 to which the inverted signal CL of clear signal $\overline{CL}$ is supplied is used and a connection node between MOS transistors Q11 and Q12 is connected to control signal line 58.

With the above construction, when clear signals $\overline{CL}$ and CL are set "0" and "1" levels, respectively, MOS transistors Q15 and Q16 are set into the ON condition. Clear signal CL of "1" level causes MOS transistors Q10 to Q13 to be set into the OFF state. As a result, subword line SWLi is precharged to "1" level by means of MOS transistor Q15, and sub-word line SWL(i+1) is precharged to "1" level by means of MOS transistor Q16. In contrast, when clear signals $\overline{CL}$ and CL are respectively set to "1" and "0", MOS transistors Q15 and Q16 are set into the OFF state. Clear signal CL of "0" level causes MOS transistors Q10 and Q11 to function as an inverter, and the potential of main word line MWLi is inverted and transmitted to sub-word line SWLi. Further, MOS transistors Q13 and Q12 function as an inverter, and the potential of main word line MWL(i+1) is inverted and transmitted to sub-word line SWL(i+1). Therefore, the function of the circuit shown in FIGS. 13 and 14 can be attained.

As described above, according to the semiconductor memory device of this invention, data of part of the memory area can be simultaneously cleared or preset at a high speed without causing an erroneous operation due to occurrence of the power source noise and lowering the operation speed in the normal operation.

What is claimed is:

1. A semiconductor memory device comprising:
   a first memory cell array section having memory cells arranged in a matrix form;
   row decoder means for selecting rows of the memory cells in said first memory cell array section;
   first column decoder means for selecting columns of the memory cells in said first memory cell array section;
   a second memory cell array section having memory cells arranged in a matrix form whose rows correspond to those of said first memory cell array section;
   second column decoder means for selecting columns of the memory cells in said second memory cell array section, said second column decoder means selecting one of the columns in said second memory cell array section in the normal operation mode when none of the columns of the memory cells in said first memory sell array section is selected by said first column decoder means, selecting none of the columns of said second memory cell array section when any one of the columns of the memory cells in said first memory cell array section is selected by said first column decoder means, and selecting all of the columns of said second memory cell array section when the same data is simultaneously written into all the memory cells in said second memory cell array section; and
   logic gate means, provided between corresponding rows of the memory cells of said first and second memory cell array sections, for connecting the rows of the memory cells in said first memory cell array section to respective rows of the memory cells in said second memory cell array section in the normal operation mode so as to permit an output from said row decoder means to be transmitted to said second memory cell section, and for setting each of the rows of the memory cells in said second memory cell array section to a selected level when the same data simultaneously written into all the memory cells in said second memory cell array section.

2. A semiconductor memory device according to claim 1, wherein said logic gate means includes a plurality of OR gates which are provided correspondingly to respective rows of the memory cells in said first and second memory cell array sections; one input terminal of each of said OR gates being connected to a corresponding one of the rows of the memory cells in said first memory cell array section, the other input terminal thereof being connected to receive a control signal for selecting the normal operation or the operation of simultaneously writing the same data into said second memory cell array section, and an output terminal thereof being connected to a corresponding one of the memory cells in said second memory cell array section.

3. A semiconductor memory device according to claim 1, further comprising counter means which supplies to said row decoder means a row address signal for permitting data to be simultaneously written for each row.

4. A semiconductor memory device according to claim 1, further comprising at least one block including a memory cell array section corresponding to said second memory cell array section, column decoder means corresponding to said second column decoder means and logic gate means corresponding to said logic gate means, wherein the same data is simultaneously and selectively written into said at least one block.

5. A semiconductor memory device according to claim 1, wherein said same data is "0", and data stored in each of said memory cells in said memory cell array section is cleared.

6. A semiconductor memory device according to claim 1, wherein said same data is "1", data of "1" is preset into each of the memory cells in said memory cell array section.

7. A semiconductor memory device comprising:
   a first memory cell array section having memory cells arranged in a matrix form;
   row decoder means for selecting rows of the memory cells in said first memory cell array section;

first column decoder means for selecting columns of the memory cells in said first memory cell array section;

a second memory cell array section having memory cells arranged in a matrix form whose rows correspond to those of said first memory cell array section;

second column decoder means for selecting columns of the memory cells in said second memory cell array section;

simultaneous selecting means for selecting all of the columns of said second memory cell array section when the same data is simultaneously written into all the memory cells in said second memory cell array section; and logic gate means, provided between corresponding rows of the memory cells of said first and second memory cell array sections, for connecting the rows of the memory cells in said first memory cell array section to respective rows of the memory cells in said second memory cell array section in the normal operation mode so as to permit an output from said row decoder means to be transmitted to said second memory cell array section, and for selecting each of the rows of the memory cells in said second memory cell array section when the same data is simultaneously written into all the memory cells in said second memory cell array section.

8. A semiconductor memory device according to claim 7, wherein said logic gate means includes a plurality of OR gates each of which has one input terminal connected to a corresponding one of the rows of the memory cells in said first memory cell array section, the other input terminal connected to receive a control signal for selecting the normal operation or the operation of simultaneously writing the same data into said second memory cell array section, and an output terminal connected to a corresponding one of the memory cells in said second memory cell array section.

9. A semiconductor memory device according to claim 7, wherein said same data is "0", and data stored in each of said memory cells in said memory cell array section is cleared.

10. A semiconductor memory device according to claim 7, wherein said same data is "1", data of "1" is preset into each of the memory cells in said memory cell array section.

11. A semiconductor memory device according to claim 7, wherein said simultaneous selection means includes a plurality of MOS transistors whose current paths are each connected between each of the columns of the memory cells in said second memory cell array section and the ground terminal and which are turned on when said logic gate means permits the same data to be simultaneously written into the memory cells in said second memory cell array section, and data of "0" is written as said same data.

12. A semiconductor memory device according to claim 7, which further, comprises load means for precharging each bit line of the memory cells in said memory cell array section and in which said simultaneous selection means includes a plurality of MOS transistors whose current paths are serially connected with the respective columns of the memory cells in said second memory cell array section and which are turned off when said logic gate means causes the same data to be simultaneously written into the memory cells in said second memory cell array section, and each of the columns of the memory cells in said second memory cell array section is precharged so as to write data of "1" as said same data into each of the memory cells in said second memory cell array section.

13. A semiconductor memory device comprising:
a group of memory cell arrays each having a plurality of memory cells arranged in a matrix form;

a plurality of sub-word lines respectively connected to the rows of memory cells in said group of memory cell arrays;

main word lines provided correspondingly to said sub-word lines and commonly for said group of memory cell arrays;

selection means, provided correspondingly to the rows of each of the memory cell arrays in said group of memory cell arrays, for connecting the sub-word lines of a selected one of said memory cell arrays to a corresponding one of said main word lines;

row decoder means for selecting said main word lines;

first column decoder means for selecting the columns of said group of memory cell arrays;

a memory cell array section having memory cells which are arranged in a matrix form and whose rows are set to correspond to the rows of said group of memory cell arrays;

second decoder means for selecting the memory cells in said memory cell array section, said second decoder means selecting one of the memory cells in said memory cell array section in the normal operation mode when none of the columns is selected by said first column decoder means, and for simultaneously selecting the columns of the memory cells when the same data is written into the memory cells in said memory cell array section; and logic gate means, provided between the rows of said group memory cells arrays and the respective rows of said memory cell array section, for connecting said main word lines to the respective sub-word lines of said memory cell array section in normal operation mode, and for setting the sub-word lines of said memory cell array section to a selected level when the same data is simultaneously written into the memory cells of said memory cell array section.

14. A semiconductor memory device according to claim 13, wherein said selection means includes a plurality of NOR gates which are respectively connected at one input terminal to said main word lines, and connected at the other input terminal to respectively receive signals for selecting the memory cells in said group of memory cell arrays.

15. A semiconductor memory device according to claim 13, wherein said logic gate means includes a plurality of OR gates which are respectively connected at one input terminal to said main word lines, and connected at the other input terminal to respectively receive signals for selecting the memory cells in said memory cell array section and a plurality of NAND gates which are connected at one input terminal to respective output terminals of said plurality of OR gates, connected at the other input terminal to receive a signal for specifying the normal operation or the operation of simultaneously writing the same data into said memory cell array section and connected at an output terminal to said sub-word lines in said memory cell array section, respectively.

16. A semiconductor memory device according to claim 13, wherein said logic gate means includes a plurality of NAND gates which are provided correspondingly to the rows of the memory cells in said group of memory cell arrays and said memory cell array section, one input terminal of each of said NAND gates being connected to a corresponding one of said main word lines, the other input terminal thereof being connected to receive a signal for specifying the normal operation or the operation of simultaneously writing the same data into said memory cell array section and an output terminal thereof being connected to a corresponding one of said sub-word lines in said memory cell array section.

17. A semiconductor memory device according to claim 13, wherein said logic gate means includes a plurality of NOR gates which are provided correspondingly to the rows of the memory cells in said group of memory cell arrays and said memory cell array section, one input terminal of each of said NOR gates being connected to the corresponding one of said main word lines, the other input terminal thereof being connected to receive a signal for specifying the normal operation or the operation of simultaneously writing the same data into said memory cell array section, and an output terminal thereof being connected to a corresponding one of said sub-word lines in said memory cell array section, and a plurality of inverters having input terminals respectively connected to the output terminals of said NOR gates and output terminals respectively connected to sub-word lines of said memory cell array section.

18. A semiconductor memory device according to claim 13, wherein said same data is "0" and data stored in each of the memory cells of said memory cell array section is cleared.

19. A semiconductor memory device according to claim 13, wherein said data is "1" and each of the memory cells of said memory cell section is preset to "1".

* * * * *